United States Patent

Dennison et al.

[11] Patent Number: 5,939,761
[45] Date of Patent: Aug. 17, 1999

[54] METHOD OF FORMING A FIELD EFFECT TRANSISTOR

[75] Inventors: Charles H. Dennison, Meridian; Aftab Ahmad, Boise, both of Id.

[73] Assignee: Micron Technology, Inc., Boise, Id.

[21] Appl. No.: 08/929,693

[22] Filed: Sep. 15, 1997

Related U.S. Application Data

[62] Division of application No. 08/583,482, Jan. 5, 1996.

[51] Int. Cl.⁶ .................................................. H01L 29/76
[52] U.S. Cl. ........................................ 257/387; 257/773
[58] Field of Search ................................... 257/387, 773

[56] References Cited

U.S. PATENT DOCUMENTS

| | | | |
|---|---|---|---|
| 4,169,270 | 9/1979 | Hayes | 257/387 |
| 4,744,859 | 5/1988 | Hu et al. | 438/303 |
| 4,916,084 | 4/1990 | Shibata et al. | 438/297 |
| 4,966,870 | 10/1990 | Barber et al. | 438/637 |
| 5,112,765 | 5/1992 | Cederbaum et al. | 438/152 |
| 5,141,883 | 8/1992 | Ferla et al. | 148/DIG. 126 |
| 5,229,326 | 7/1993 | Dennison et al. | 438/524 |
| 5,328,862 | 7/1994 | Goo | 438/305 |
| 5,439,839 | 8/1995 | Jang | 438/305 |
| 5,510,290 | 4/1996 | Kwon | 438/439 |
| 5,573,965 | 11/1996 | Chen et al. | 438/297 |

*Primary Examiner*—Mark V. Prenty
*Attorney, Agent, or Firm*—Wells, St. John, Roberts, Gregory & Matkin, P.S.

[57] ABSTRACT

A method for forming a field effect transistor on a substrate includes providing a wordline on the substrate; providing composite masking spacers laterally outward relative to the wordline, the composite masking spacers comprising at least two different materials; removing at least one of the materials of the composite masking spacers to effectively expose the substrate area adjacent to the wordline for conductivity enhancing doping; and subjecting the effectively exposed substrate to conductivity enhancing doping to form source/drain regions. Another aspect of the invention is to provide a method for forming a field effect transistor including providing a gate on the substrate, providing a first layer of nitride over the gate; providing a second layer of a masking material over the first layer of nitride; anisotropically etching the first and second layers to define composite oxidation masking spacers positioned laterally outward relative to the patterned gate; and exposing the substrate to oxidation condition effective to form a field oxide region laterally outward of the composite oxidation masking spacers, the composite oxidation masking spacers effectively restricting oxidation of the substrate therebeneath.

1 Claim, 4 Drawing Sheets

METHOD OF FORMING A FIELD EFFECT TRANSISTOR

RELATED PATENT DATA

This is a divisional application claiming priority to U.S. patent application Ser. No. 08/583,482, filed Jan. 5, 1996, by Charles H. Dennison et al., and entitled "Method of Forming a Field Effect Transistor".

TECHNICAL FIELD

This invention relates generally to the formation of a field effect transistor on a substrate, and more specifically, to a method for forming a field effect transistor which provides somewhat precisely defined active area regions adjacent to the field effect transistor.

BACKGROUND OF THE INVENTION

As DRAMs increase in memory cell density, it becomes increasingly difficult to properly align the various masks needed during the manufacturing process, thereby permitting a contact opening to be provided to the underlying active areas. Heretofore, a misalignment area was provided for in the area about the contact area to assure that electrical contact would be made to the underlying active area. As densities have further increased, improved methods have been devised to provide a so-called "self-aligning" mask. For example, the prior art methods have included a step of encapsulating a wordline in a nitride material. Subsequent etches of other materials deposited on the nitride layer were selective relative to the nitride layer such that it "self aligned" relative to the nitride covered wordline.

Although the method outlined above operated with some degree of success, it still has shortcomings which have detracted from its usefulness. For instance, some misalignment tolerance still had to be provided for. Consequently, mask misalignment could still result in providing too little room on one side of the gate for the formation of active area contacts and associated diffusion regions. As noted earlier, the goal of manufacturers continues to be to make the circuitry far more dense. Therefore, any mask misalignment can cause serious difficulties during the manufacturing process. The present method for manufacturing a field effect transistor provides a method which enables definition of controlled size active area regions adjacent to the gates.

BRIEF DESCRIPTION OF THE DRAWINGS

Preferred embodiments are described below with reference to the following accompanying drawings.

DETAILED DESCRIPTION OF THE PREFERRED EMBODIMENTS

Figure 1:
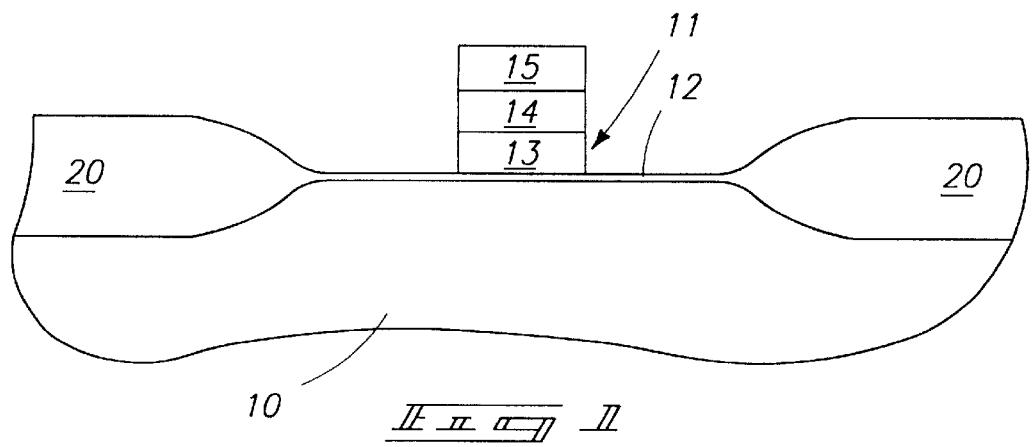
FIG. 1 is a diagrammatic section of a semiconductor wafer shown at one processing step in accordance with the present invention.

This disclosure of the invention is submitted in furtherance of the constitutional purposes of the U.S. Patent Laws "to promote the progress of science and useful arts" (Article 1, Section 8).

In accordance with one aspect of the invention, a method for forming a field effect transistor on a substrate comprises:

masking a discrete active area of the substrate while leaving opposed areas adjacent the discrete active area exposed;

providing first field oxide regions on the exposed opposed areas;

stripping the masking from the active area and providing a patterned gate within the active area;

providing a first layer of nitride to a first thickness over the patterned gate and adjacent substrate area;

providing a second layer of a masking material to a second thickness over the first layer of nitride;

anisotropically etching the second and first layers to define composite oxidation masking spacers of the first and second layers laterally outward relative to the patterned gate;

exposing the substrate to oxidation conditions effective to grow secondary field oxide regions laterally outward of the oxidation masking spacers, the secondary field oxide regions joining with the first field oxide regions, the oxidation masking spacers effectively restricting oxidation of the substrate therebeneath;

after forming the secondary field oxide regions, removing at least the second layer from the composite oxidation masking spacers, to effectively expose substrate area adjacent to the patterned gate for conductivity enhancing impurity doping; and after removing the second layer from the composite oxidation masking spacers, subjecting the substrate to effective conductivity enhancing impurity doping to form source/drain regions adjacent the patterned gate.

Still another aspect of the present invention includes a method for forming a field effect transistor on a substrate, comprising:

providing first field oxide regions on predetermined areas of the substrate;

providing a wordline on the substrate and adjacent the first field oxide region;

providing a nitride layer over the wordline;

providing an oxide layer over the nitride layer;

anisotropically etching the nitride and oxide layers to form composite nitride and oxide spacers which are positioned laterally outward relative to the wordline;

providing secondary field oxide regions adjacent to the composite nitride and oxide spacers and joining with the first field oxide regions;

removing at least a portion of the composite nitride and oxide spacers thereby effectively exposing the substrate therebeneath;

subjecting the effectively exposed substrate to conductivity enhancing impurity doping to form source and drain regions;

providing a first electrically insulative layer over the wordline;

anisotropically etching the first electrically insulative layer;

providing an etch stop layer over the first electrically insulative layer;

providing and patterning a second electrically insulative layer over the etch stop layer;

etching a contact opening through the second electrically insulative layer using the etch stop layer as an etch stop;

etching the etch stop layer to extend the contact opening through the etch stop layer and effectively exposing the substrate therebeneath; and providing an electrically conductive layer in the contact opening to electrically contact the underlying substrate.

Another aspect of the present invention includes providing a method for forming a field effect transistor on a substrate comprising:

providing a wordline on the substrate;

providing composite masking spacers laterally outward relative to the wordline, the composite masking spacers comprising at least two different materials;

removing at least one of the materials of the composite masking spacers to effectively expose the substrate area adjacent to the wordline for conductivity enhancing doping; and subjecting the effectively exposed substrate to conductivity enhancing doping to form source/drain regions.

Still further, another aspect of the present invention is to provide a method for forming a field effect transistor on a substrate comprising:

providing a gate on the substrate;

providing a first layer of nitride over the gate;

providing a second layer of a masking material over the first layer of nitride;

anisotropically etching the first and second layers to define composite oxidation masking spacers of the first and second layers positioned laterally outward relative to the patterned gate; and exposing the substrate to oxidation conditions effective to form a field oxide region laterally outward of the composite oxidation masking spacers, the composite oxidation masking spacers effectively restricting oxidation of the substrate therebeneath.

Referring first to FIG. 1, a semiconductor wafer or substrate is indicated generally by reference to numeral 10. The substrate 10 has deposited thereon a patterned gate or wordline 11. The wordline or gate is of conventional construction having an oxide layer 12, a polysilicon layer 13, an oxide layer 14 and an uppermost layer of nitride which is indicated by the numeral 15. Still further, first field oxide regions 20 are provided on predetermined areas of the substrate 10. In this regard, the formation of the first field oxide regions 20 generally includes masking a discrete active area of the substrate 10 while leaving opposed areas adjacent the discrete active area exposed; and exposing the substrate 10 to oxidation conditions effective to grow the first field oxide regions 20 on the exposed opposed areas. Still further, and following the formation of the first field oxide regions 20, the mask would be stripped and the patterned gate or wordline 11 would be provided in a position adjacent to the first field oxide regions 20. The active area regions will be discussed in greater detail hereinafter.

Figure 2:
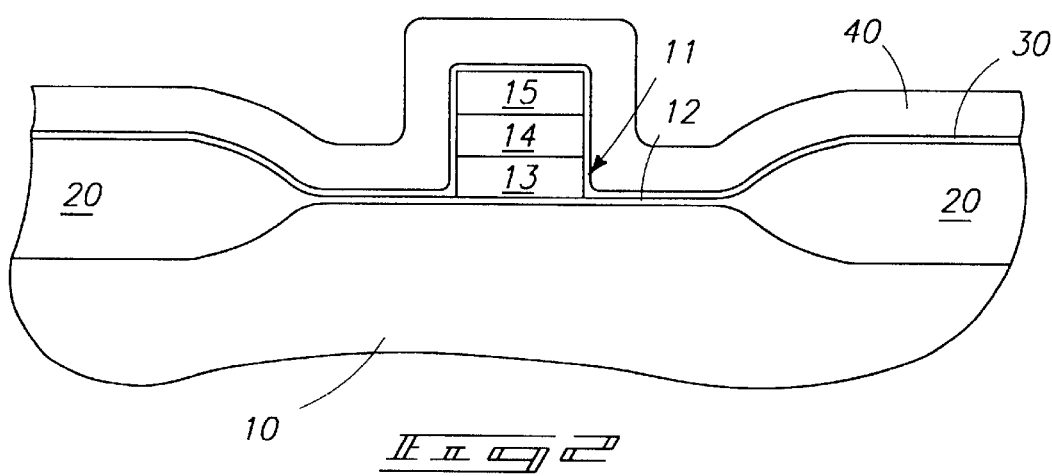
FIG. 2 is a diagrammatic section of the FIG. 1 wafer illustrated at a processing step subsequent to that shown in FIG. 1.

Referring now to FIG. 2, a first layer of nitride 30 is applied to a first thickness over the patterned gate 11 and adjacent substrate areas. The preferred first thickness is less than or equal to about 700 Angstroms. A second layer of masking material, which preferably comprises a doped oxide 40, is deposited over the first layer of nitride 30. Doped oxide layer 40 preferably has an etch rate greater than the etch rate for the first field oxide regions 20.

Figure 3:
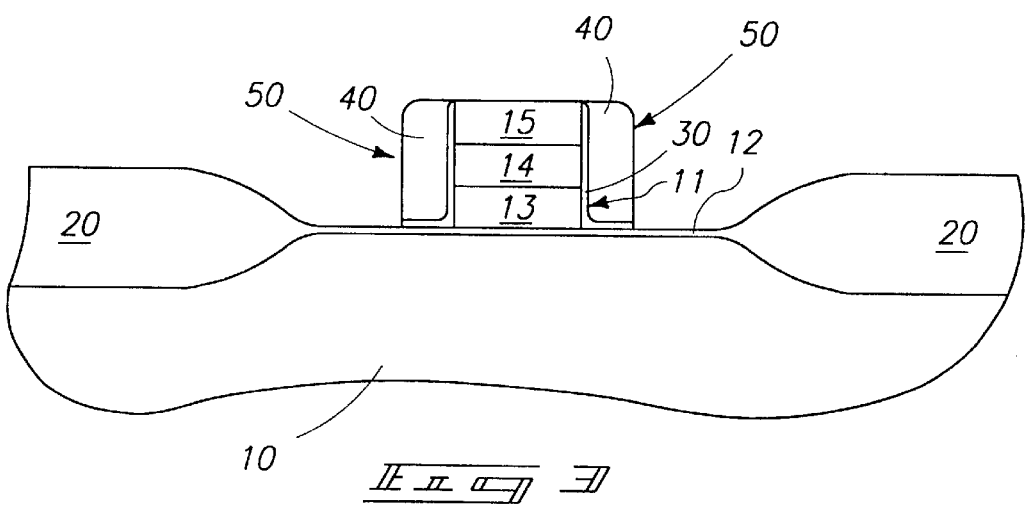
FIG. 3 is a diagrammatic section of the FIG. 1 wafer illustrated at a processing step subsequent to that shown in FIG. 2.

Referring to FIG. 3, the first layer of nitride 30 and the second layer of masking material 40 are anisotropically etched to define composite oxidation masking spacers 50 which are positioned laterally outward relative to the patterned gate 11 and which comprise at least two different materials. As will be recognized by a study of FIG. 3, the composite oxidation masking spacers 50 have a given width which will be utilized to define source/drain regions where conductivity enhancing impurity doping occurs at a later step in the method. The source/drain regions will be discussed in greater detail hereinafter.

Figure 4:
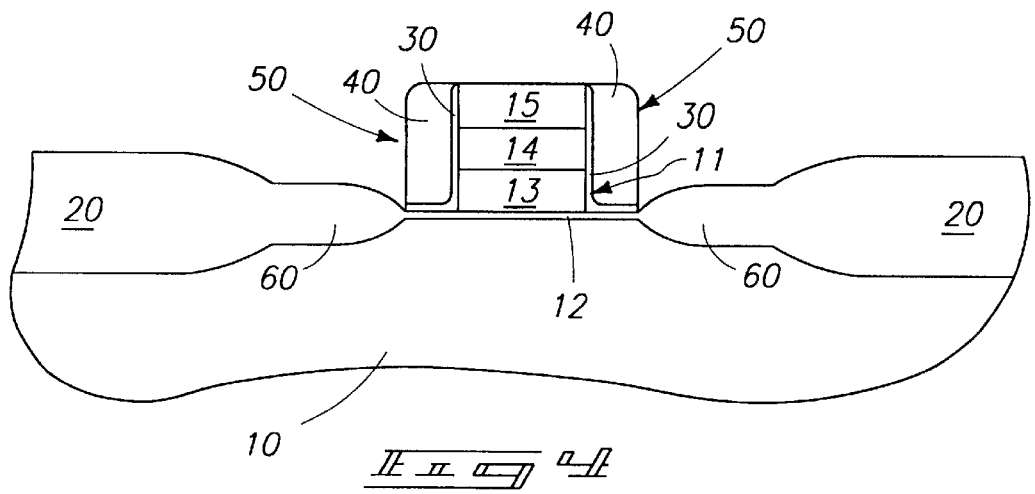
FIG. 4 is a diagrammatic section of the FIG. 1 wafer illustrated at a processing step subsequent to that shown in FIG. 3.
Figure 5:
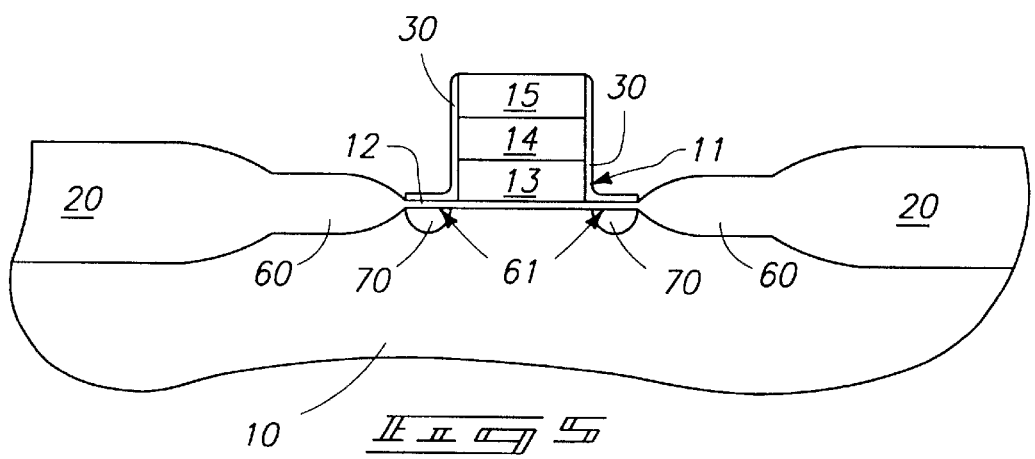
FIG. 5 is a diagrammatic section of the FIG. 1 wafer illustrated at a processing step subsequent to that shown in FIG. 4.
Figure 6:
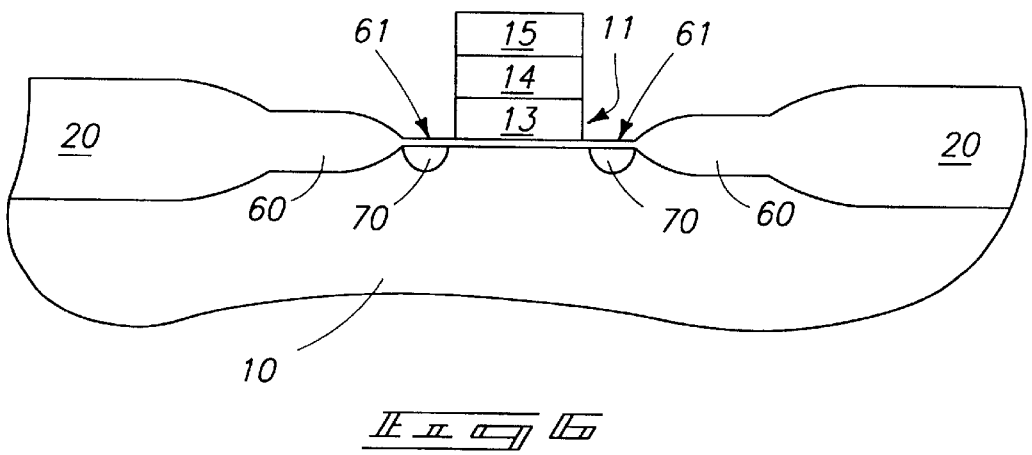
FIG. 6 is a diagrammatic section of the FIG. 1 wafer illustrated at a processing step subsequent to that shown in FIG. 5.

Referring to FIG. 4, the substrate 10 is exposed to oxidation conditions effective to form secondary field oxide regions 60 adjacent to the composite nitride and oxide spacers 50 and joining with the first field oxide regions 20. Thereafter, and referring now to FIG. 5, the substrate 10 is subjected to conditions which effectively removes at least a portion of the composite nitride and oxide spacers 50 thereby effectively exposing a substrate area 61 therebeneath. With respect to FIG. 5, the second layer of doped oxide 40 is shown removed from the composite oxidation masking spacers 50. The first layer of nitride is shown removed in FIG. 6. The effectively exposed substrate 61 in FIG. 5 is subjected to conductivity enhancing impurity doping to form source/drain regions which are indicated by the numeral 70.

Figure 7:
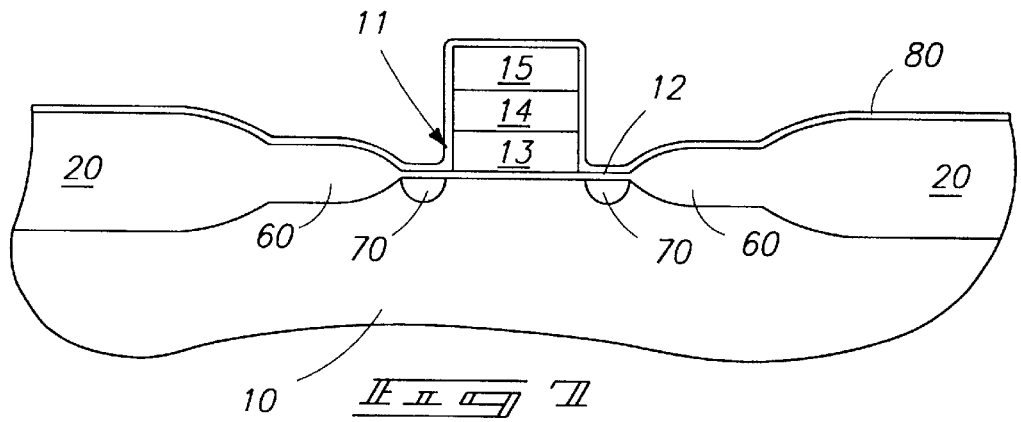
FIG. 7 is a diagrammatic section of the FIG. 1 wafer illustrated at a processing step subsequent to that shown in FIG. 6.
Figure 8:
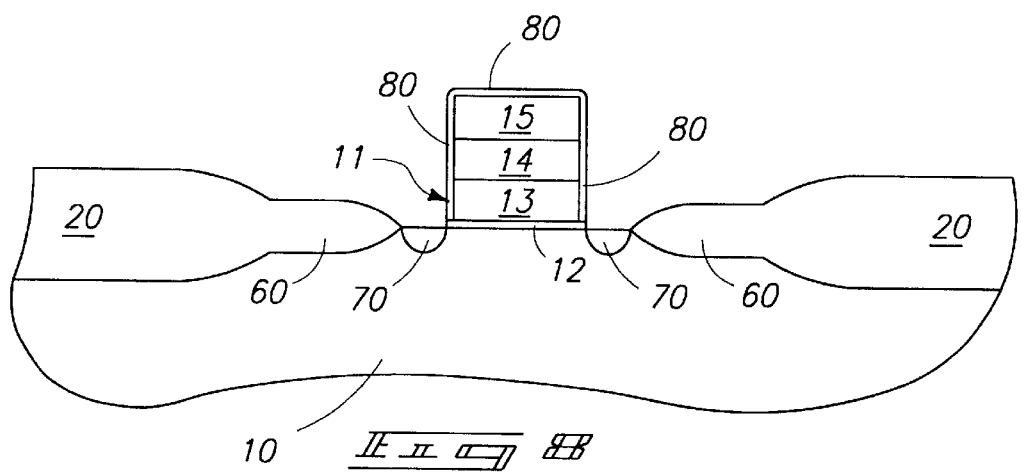
FIG. 8 is a diagrammatic section of the FIG. 1 wafer shown at a processing step subsequent to that shown in FIG. 7.
Figure 9:
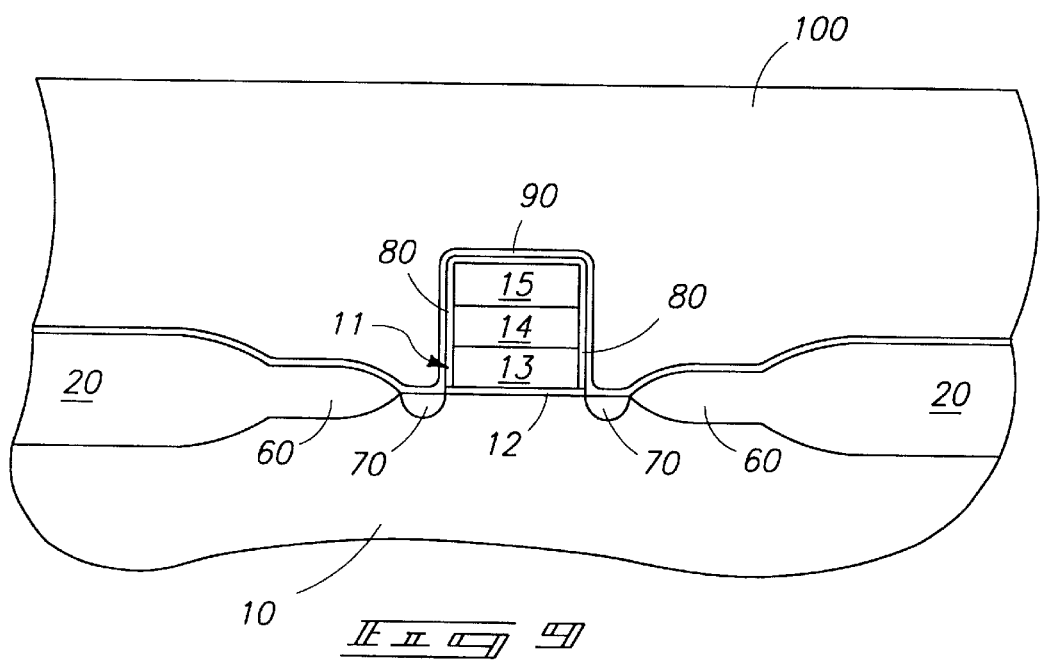
FIG. 9 is a diagrammatic section of the FIG. 1 wafer illustrated at a processing step subsequent to that shown in FIG. 8.

Referring to FIG. 7, a first electrically insulative layer 80 is provided over the wordline 11. The first electrically insulative layer is preferably selected from the group consisting of silicon nitride and oxide. The first electrically insulative layer 80 is anisotropically etched along with etching of layer 12, as shown in FIG. 8. An etch stop layer 90 is then provided over the first electrically insulative layer 80 (FIG. 9). The etch stop layer 90 preferably comprises silicon nitride and is deposited to a thickness of greater than or equal to about 100 Angstroms. A second electrically insulative layer 100 is provided over the etch stop layer 90. Preferably, the second electrically insulative layer 100 comprises BPSG.

Figure 10:
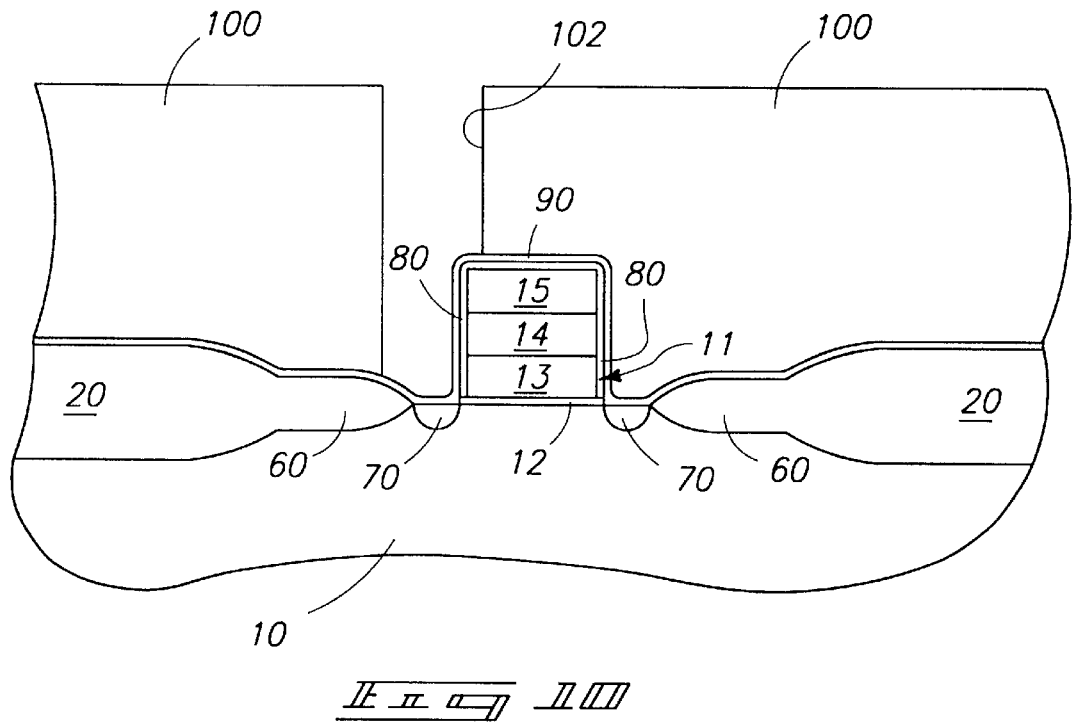
FIG. 10 is a diagrammatic section of the FIG. 1 wafer illustrated at a processing step subsequent to that shown in FIG. 9.
Figure 11:
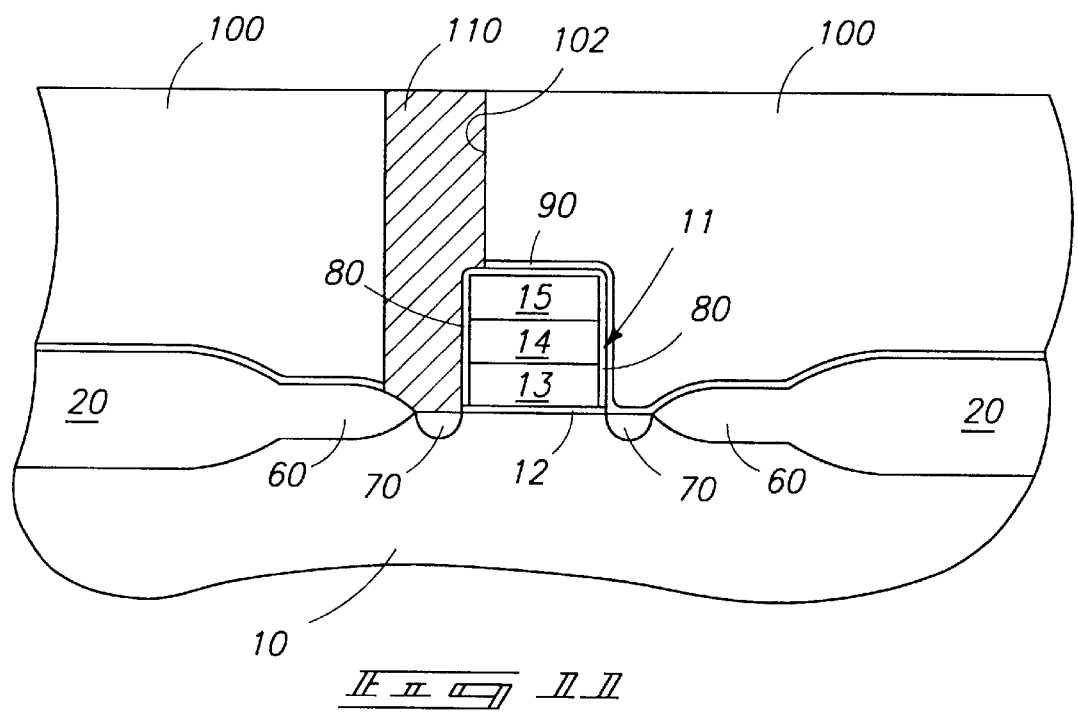
FIG. 11 is a diagrammatic section of the FIG. 1 wafer illustrated at a processing step subsequent to that shown in FIG. 10.

Referring to FIG. 10, the insulative layer 100 is patterned and a contact opening 102 is etched therethrough using the etch stop layer 90 as an etch stop. Referring to FIG. 11, the method further includes the step of etching the etch stop layer 90 to extend the contact opening 102 through the etch stop layer and effectively exposing the diffusion regions 70 of the substrate 10 therebeneath. The present method additional includes a final step of providing an electrically conductive layer 110 in the contact opening 102 to electrically contact the underlying substrate 10.

In compliance with the statue, the invention has been described in language more or less specific as to its structural and methodical features. It is to be understood, however, that the invention is not limited to the specific features shown and described since the means herein disclosed comprise preferred forms of putting the invention into effect. The invention is therefore claimed in any of its forms or modifications within the proper scope of the appended claims appropriately interpreted in accordance with the Doctrine of Equivalents.

We claim:

1. A field effect transistor, comprising:

a substrate having an active area;

a first field oxide region positioned on the substrate and in spaced relation relative to the active area, and wherein the first field oxide region has a given thickness dimension;

a wordline on the active area of the substrate and which is positioned in spaced relation relative to the first field oxide region, and wherein the wordline has a pair of sidewalls and a top surface;

a second field oxide region which is continuous with the first field oxide region, and disposed between the first field oxide region and the wordline, and wherein the second field oxide region is disposed in spaced relation relative to the wordline, and further has a thickness which is less than the thickness of the first field oxide region;

a first electrically insulative layer covering the pair of sidewalls and the top surface of the wordline;

source and drain regions located in the substrate, adjacent the wordline and between the wordline and the second field oxide region, and wherein the wordline does not overlie either of the source or drain regions;

a layer of silicon nitride having a thickness of about 100 Angstroms and which is positioned in partially covering relation relative to the top surface and over one of the sidewalls of the wordline, the layer of silicon nitride further extending over one of the source and drain regions and the immediately adjacent first and second field oxide regions, and wherein a portion of the electrically insulative layer on the top surface, and one of the pair of sidewalls of the wordline, remains exposed;

a second electrically insulative layer positioned outwardly of the first and second field oxide regions and the wordline, and wherein the second electrically insulative layer defines a contact opening to one of the source and drain regions; and an electrically conductive plug received in and completely filling the contact opening, the electrically conductive plug making electrical contact to one of the source and drain regions and partially overlapping the top surface of the wordline and the immediately adjacent second field oxide region, and wherein the electrically conductive plug lies against the first electrically insulative layer on the top surface and the one of the sidewalls of the wordline which are exposed.

* * * * *